United States Patent
Spirkl et al.

(10) Patent No.: US 7,728,636 B2
(45) Date of Patent: *Jun. 1, 2010

(54) CLOCK SIGNAL SYNCHRONIZING DEVICE WITH INHERENT DUTY-CYCLE CORRECTION CAPABILITY

(75) Inventors: Wolfgang Spirkl, Germering (DE); Martin Brox, München (DE); Holger Steffens, München (DE)

(73) Assignee: Qimonda AG, Munich (DE)

( * ) Notice: Subject to any disclaimer, the term of this patent is extended or adjusted under 35 U.S.C. 154(b) by 129 days.

This patent is subject to a terminal disclaimer.

(21) Appl. No.: 11/838,634

(22) Filed: Aug. 14, 2007

(65) Prior Publication Data

US 2009/0045856 A1 Feb. 19, 2009

(51) Int. Cl.
*H03L 7/06* (2006.01)
(52) U.S. Cl. .................. 327/149; 327/158; 327/233; 327/236
(58) Field of Classification Search .................. None
See application file for complete search history.

(56) References Cited

U.S. PATENT DOCUMENTS

| | | | |
|---|---|---|---|
| 6,087,857 A * | 7/2000 | Wang | 327/5 |
| 6,501,482 B1 | 12/2002 | Rosman et al. | |
| 6,583,655 B2 * | 6/2003 | Takahashi et al. | 327/160 |
| 6,879,623 B2 | 4/2005 | Agami et al. | |
| 7,142,026 B2 | 11/2006 | Kwak | |
| 2003/0132790 A1 * | 7/2003 | Amick et al. | 327/158 |
| 2003/0161430 A1 * | 8/2003 | Sou | 375/376 |
| 2006/0188051 A1 * | 8/2006 | Donnelly et al. | 375/371 |
| 2008/0260071 A1 * | 10/2008 | Sidiropoulos et al. | 375/334 |

\* cited by examiner

*Primary Examiner*—Tuan Lam
(74) *Attorney, Agent, or Firm*—Dicke, Billig & Czaja, PLLC

(57) ABSTRACT

One aspect relates to a clock signal synchronizing device, in particular to a delayed locked loop (DLL) with capability to correct static duty-cycle offset and to filter clock-jitter. One aspect relates to a clock signal synchronizing method with capability to correct static duty-cycle offset and to filter clock-jitter. In accordance one aspect, there is provided a clock signal synchronizing device including a delay circuit having a variable delay time and delaying an incoming clock signal or a signal generated therefrom to output a delayed clock signal. Also included is a negator for inverting the delayed clock signal to output an inverted delayed clock signal. Also included is a delay control circuit for controlling the delay circuit to adjust the phase relation between the incoming clock signal and the inverted delayed clock signal and a phase interpolator. The phase interpolator is activated when the incoming clock signal and the inverted delayed clock signal are substantially in phase and adds the incoming clock signal multiplied with a factor of substantially (1−p) to the inverted delayed clock signal multiplied with a factor of substantially p to output a compound signal to the delay circuit, p being a real number greater than or equal to 0 and smaller than or equal to 1.

20 Claims, 4 Drawing Sheets

CLOCK SIGNAL SYNCHRONIZING DEVICE WITH INHERENT DUTY-CYCLE CORRECTION CAPABILITY

BACKGROUND

The invention relates to a clock signal synchronizing device, in particular to a delayed locked loop (DLL).

SUMMARY

One embodiment relates to a clock signal synchronizing device, in particular to a delayed locked loop (DLL) with capability to correct static duty-cycle offset and to filter clock-jitter. One aspect relates to a clock signal synchronizing method with capability to correct static duty-cycle offset and to filter clock-jitter.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
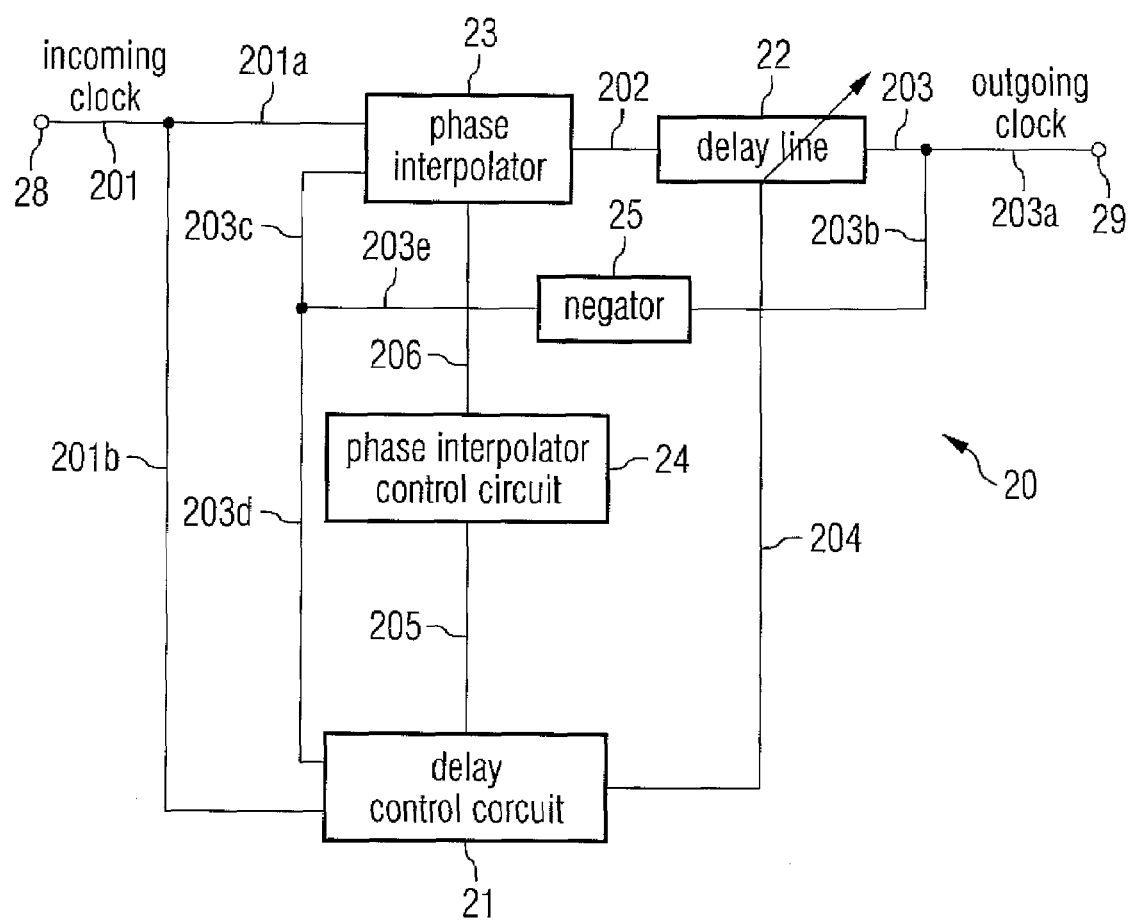
FIG. 1 illustrates a simplified exemplary schematic diagram of a DLL according to an embodiment of the invention.

FIG. 1 illustrates a simplified exemplary schematic diagram of a DLL according to an embodiment of the invention.

The DLL 20 comprises a delay control circuit 21, a delay circuit 22, hereinafter referred to as delay line, a phase interpolator 23, a phase interpolator control circuit 24, a negator 25, an input 28, and an output 29.

The delay control circuit 21 has a first input connected to the input 28 of the DLL 20 via connection 201 and connection 201b and a second input connected to an output of the negator 25 via connection 203d and connection 203e. A first output of the delay control circuit 21 is connected to a second input of the delay line 22 via connection 204 and a second output is connected to an input of the phase interpolator control circuit 24 via connection 205.

The delay line 22 has a first input connected with an output of the phase interpolator 23 via connection 202 and the second input connected with the first output of the delay control circuit 21. An output of the delay line 22 is connected with the input of the negator 25 via connection 203 and connection 203b and with the output 29 of the DLL 20 via connection 203 and connection 203a.

The phase interpolator 23 has a first input connected to the input 28 of the DLL 20 via connection 201 and connection 201a, the second input connected to the output of the negator 25 via connection 203c and connection 203e, and a third input connected to an output of the phase interpolator control circuit 24 via connection 206. The output of the phase interpolator 23 is connected to the input of the delay line 22.

The phase interpolator control circuit 24 has its input connected to the second output of the delay control circuit 21 and its output connected to the third input of the phase interpolator 23.

The negator 25 has its input connected to the output of the delay line 22 via connection 203 and connection 203b. The output of the negator 25 is connected with the second input of the phase interpolator 23 via connection 203e and connection 203c and is also connected with the second input of the delay control circuit 21 via connection 203e and connection 203d.

The delay line 22 having a variable delay is initialized with a predetermined value, which may be calculated, for example, by means of a suitable algorithm and which represents a delay expected for a corresponding circuit. During operation of the DLL 20, the variable delay of the delay line 22 is controlled by the delay control circuit 21.

The phase interpolator 23 receives two clock signals at its inputs and adds the two clock signals with variable quantifiers. The variable quantifiers are controlled by the phase interpolator control circuit 24 and represent factors with which the two clock signals are multiplied before they are added. The clock signal at the first input of the phase interpolator 23 is multiplied with a factor of (1−p) and the clock signal at the second input of the phase interpolator 23 is multiplied with a factor of p, p being a real number greater than or equal to 0 and smaller than or equal to 1.

However, for a correct operation of the DLL 20, the DLL has first to be in a "locked state", that is, the two clock signals received at the inputs of the delay control circuit 21 have to be phase aligned, before activating the phase interpolator 23. When the phase interpolator 23 is not activated the factor p is set to 0 by the phase interpolator control circuit 24 which, in this case, results in forwarding the incoming clock signal without any modification as, in this case, the clock signal at the first input of the phase interpolator 23 is multiplied with 1, whereas the clock signal at the second input of the phase interpolator 23 is multiplied with 0.

The negator 25 inverts the clock signal received at its input, that is, rising edges of the non-inverted signal are replaced by falling edges in the inverted signal, and falling edges of the non-inverted signal are replaced by rising edges in the inverted signal.

The delay control circuit 21 compares the phases of the clock signals received at its two inputs and, if the two clock signals are not in phase, adjusts the variable delay of the delay line 22, until the two clock signals at the inputs of the delay control circuit 21 are in phase.

As mentioned before in connection with the phase interpolator 23, the DLL 20 has to be in a "locked state" before activating the phase interpolator 23. Thus, two operation modes of the DLL 20 will be described separately in the following. First, when the DLL 20 is not in a "locked state" yet, and second, when the DLL 20 is in a "locked state".

When the DLL 20 is not in a "locked state" the phase interpolator is not activated (p=0) and the delay line 22 receives the unmodified incoming clock signal at its first input and delays the incoming clock signal by the variable delay controlled by the delay control circuit 21. The delayed clock signal from the output of the delay line 22 which is also relayed to the output 29 as outgoing clock signal is then inverted by the negator 25 and relayed to the second input of the delay control circuit 21. The delay control circuit 21 compares the phase of the incoming clock signal and the phase of the inverted delayed clock signal and, if the two clock signals are not in phase, adjusts the variable delay of the delay line 22, that is, for example, increases the variable delay by a predetermined step. In other embodiments, the delay control circuit 21 may decrease the variable delay by a predetermined step.

Then, a new cycle begins and the delay line 22 receives the incoming clock signal at its first input and delays the incoming clock signal by the adjusted variable delay. The delayed clock signal from the output of the delay line 22 is then inverted by the negator 25 and relayed to the second input of the delay control circuit 21. The delay control circuit 21 compares the phase of the incoming clock signal and the phase of the inverted delayed clock signal and, if the two clock signals are not in phase, adjusts the variable delay of the delay line 22, that is, for example, increases (or for example, decreases) the variable delay by a predetermined step.

Then again, a new cycle begins and the process is iterated, that is, the variable delay of the delay line 22 is adjusted, until the DLL is "locked" and the incoming clock signal and the inverted delayed clock signal are in phase.

As the delay control circuit 21 receives at its first input the incoming clock signal and at its second input the inverted delayed clock signal and, however, the (non-inverted) delayed clock signal is relayed to the output 29 as the outgoing clock signal, the delay control circuit adjusts the variable delay of the delay line 22 such that the inverted outgoing signal is phase adjusted to the incoming signal that is, a rising edge of the outgoing clock signal is aligned with a falling edge of the incoming clock signal and vice versa.

Therefore, when the DLL 20 is "locked" and, if the duty-cycle of the incoming clock signal is an ideal 50%, then the phase of the outgoing signal differs from the phase of the incoming signal by half a clock period of the incoming clock signal (plus an integer multiple of the clock period of the incoming clock signal).

It is noted that the delay control circuit 21 either increases the variable delay in each cycle until the two clock signals at its input are in phase or decreases the variable delay in each cycle until the two clock signals are in phase.

Thus, it is guaranteed that the DLL 20 locks after a certain maximum of cycles at the latest, the maximum being the period of the incoming clock signal divided by the predetermined step for adjusting the variable delay of the delay line 22.

The delay line 22 may comprise a counter which counts the number of predetermined steps by which the variable delay of the delay line 22 is increased (decreased). Each time the counter receives a respective signal from the delay control circuit via connection 204, a count of the counter is increased (decreased) by 1. In this case, the count (together with the predetermined value for the initialization of the delay line 22) specifies the value of the variable delay of the delay line 22.

The DLL 20 may further comprise a delay circuit having a constant delay, hereinafter also referred to as constant delay element, which may be placed directly after the delay line 22. The constant delay of the constant delay element may adjusted suitably to replace the abovementioned initialization of the delay line 22 with the predetermined value so that the variable delay of the delay line starts with 0.

As illustrated above, the DLL will be in a "locked state" after running through a certain limited number of cycles.

Up to this point, clock-jitter and static duty-cycle offset have not been taken into account. Incoming clock-jitter has been directly transferred the same way as in a conventional DLL. In general, however, this is not critical since, during a start of a system, an associated controller responsible for generating the (incoming) clock signal—and also for introducing clock-jitter—comprises a rather low activity whereas low activity of the controller means low clock-jitter of the generated clock-signal. Activity of the controller will not be high until a certain time and at this point, when the activity of the controller increases, the DLL 20 will already be in a "locked state". Also, initial duty-cycle deviations which are not corrected until the DLL 20 is in a "locked state" are, in general, not to be considered critical.

Only then, when the incoming clock signal and the inverted outgoing clock signal are in phase, the phase interpolator control circuit 24 receives a respective signal from the delay control circuit 21 via connection 205 and activates the phase interpolator.

As mentioned before, in the phase interpolator 23, the factor p is set to 0 by the phase interpolator control circuit 24 when the phase interpolator 23 is not activated. For controlling the phase interpolator 23, the phase interpolator control circuit 24 may send a control signal comprising a respective value for the factor p: To deactivate the phase interpolator 23 and cause the phase interpolator 23 to remain deactivated, respectively, the phase interpolator control circuit may send a "0" to the phase interpolator. To activate the phase interpolator 23 and cause the phase interpolator 23 to remain activated, respectively, the phase interpolator control circuit 24 may send a signal indicating a real number greater than 0 and smaller than or equal to 1 to the phase interpolator.

The phase interpolator 23 statically phase-mixes the incoming clock signal and the inverted outgoing clock signal (signal from the output of the delay line 22 and inverted by the negator 25) to a contribution of p for the inverted outgoing clock signal and to a contribution of (1−p) for the incoming signal.

At its first input, the phase interpolator 23 receives the incoming clock signal and weights (that is, multiplies) it with a factor of (1−p). At its second input, the phase interpolator receives the inverted outgoing clock signal and weights (that is, multiplies) it with a factor of p. Then, the two weighted clock signals are added. The resulting compound signal is then relayed to the delay line 22 and delayed. The delayed compound signal which represents the outgoing signal is inverted by the negator 25 and then fed back to the second input of the phase interpolator 23 and a new cycle starts.

For an effective reduction of clock-jitter and static duty-cycle offset, multiple cycles are carried out in the way described above.

Clock-Jitter Reduction

In general, the clock-jitter is introduced by the clock-jitter of the incoming signal and is transferred to the outgoing signal. In a conventional DLL, the clock-jitter of the incoming clock signal is directly transferred to the outgoing signal. In a DLL according to an embodiment of the invention, however, clock-jitter of the incoming clock signal is filtered by the phase interpolator 23 by phase-mixing the incoming and the inverted outgoing clock signals for several cycles to average out uncorrelated clock-jitter of the incoming clock signal.

As the DLL 20 is in a "locked state" when the phase interpolator 23 is activated, the incoming and the inverted outgoing clock signals are identical except for a phase difference of a integer multiple m of the clock signal period $2\pi$, that is, $m*2\pi$, and except for clock-jitter. However, the clock-jitter of the inverted outgoing signal is also "delayed" or rather phase shifted by $m*2\pi$ (and also inverted) with respect to the jitter of the incoming signal.

Thus, the signal generated by the phase interpolator is an overlap signal of two "in-phase" signals and is therefore, of course, also in phase with the incoming signal. Under the, in general, justified assumption that the clock-jitter of the incoming clock signal is uncorrelated, in particular non periodical, the "original" clock-jitter of the incoming clock signal and the "delayed and inverted" clock-jitter of the inverted outgoing clock signal add in the same way as clock-jitters of different sources. Therefore, after several feedback loop cycles, multiple waves (clock signals) in the resonantly operated delay line 22 are overlapped such that the uncorrelated clock-jitters are averaged out.

Duty-Cycle Correction

For the duty-cycle correction performed by the DLL 20, the shape of the outgoing clock signal is to be examined. The voltage level $V_{out}(t)$ of the outgoing clock signal which depends on the time t can be written as:

$$V_{out}(t) = (1-p) \cdot V_{in}(t-T) - p \cdot V_{out}(t-T)$$

For the second cycle, $V_{out}$ can be written as:

$$V_{out}(t) = (1-p) \cdot V_{in}(t-T) - p[(1-p) \cdot V_{in}(t-2T) - p \cdot V_{out}(t-2T)]$$

For the $N^{th}$ cycle, $V_{out}(t)$ can be written as:

$$V_{out}(t) = (1-p) \cdot \sum_{n=1}^{N} p^{n-1} \cdot V_{in}(t-nT) \quad (1)$$

wherein:

$V_{in}(t)$ is the voltage level of the incoming clock signal;

T is the delay of the delay line 22.

It is noted that in the above equation, an inversion of a clock signal is represented by a multiplication by a factor of $-1$, which is justified since, for binary signals, multiplying by a factor of $-1$ is equivalent to an inversion.

For an ideal duty-cycle of 50%, the delay T is half a clock period $t_{ck}$ of the incoming clock signal plus an integer multiple m of the clock period $t_{ck}$ of the incoming clock signal):

$T = (m+\frac{1}{2})*t_{ck}$

Whereas, for a real duty-cycle unequal to 50%, T has to be calculated numerically. However, the basic operation mode of the duty-cycle correction process can be intuitively understood. Assume, the incoming clock signal has a duty-cycle of 55%. Then, after one inversion, the duty-cycle will be 45%. After the second inversion, the duty-cycle is back at 55% and so on. Therefore, a valuation for the duty-cycle of the outgoing clock signal after several feedback loop cycles may be made as follows: $(1-p)*55\%+(1-p)*p*45\%+(1-p)*p^2*55\%+\ldots$ As can be easily understood by examining the above valuation, the resulting duty-cycle of the outgoing signal will be closer to 50% than the duty cycle of the incoming signal.

Figure 4:
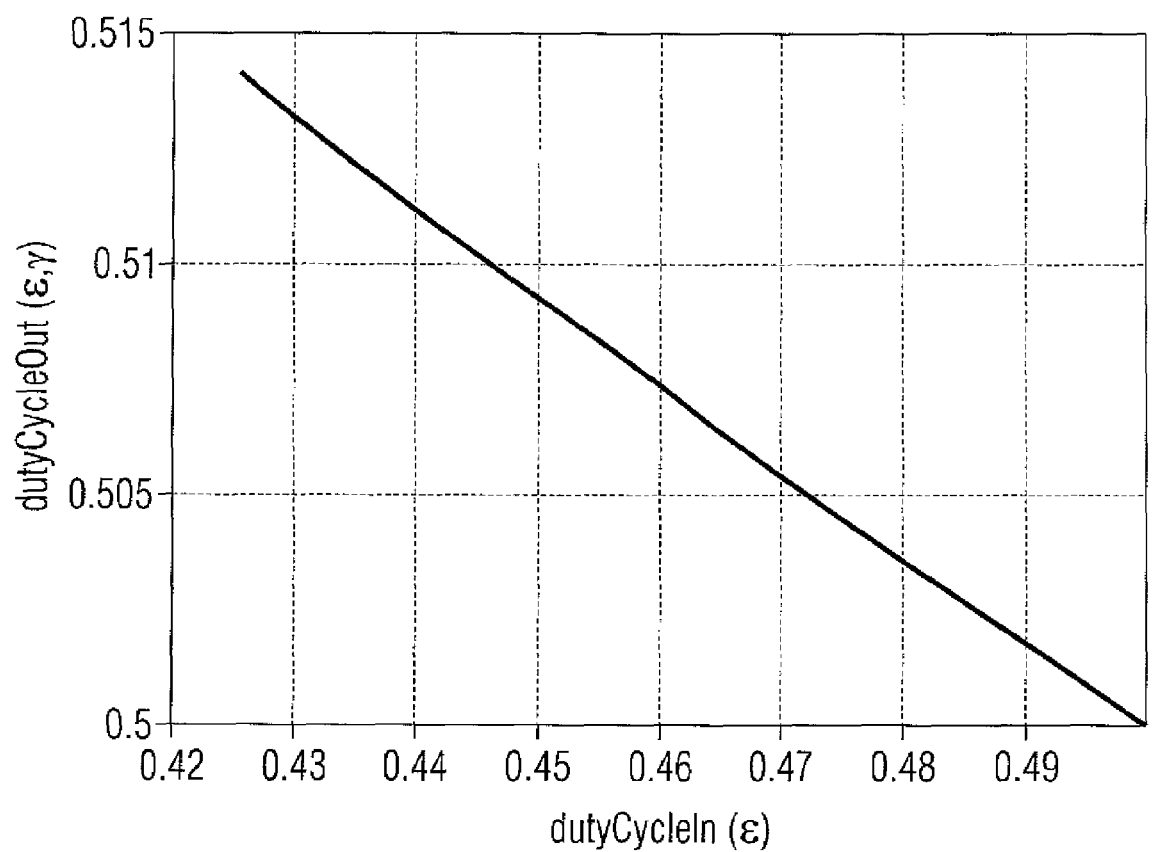
FIG. 4 depicts a graph illustrating duty-cycle correction results numerically calculated for a simulated DLL in accordance with the invention.

Therefore, by averaging over multiple inverted clocks, incoming static duty-cycle offset can be effectively reduced. A graph illustrating duty-cycle correction results numerically calculated for a simulated DLL in accordance with the invention is depicted in FIG. 4.

Figure 2:
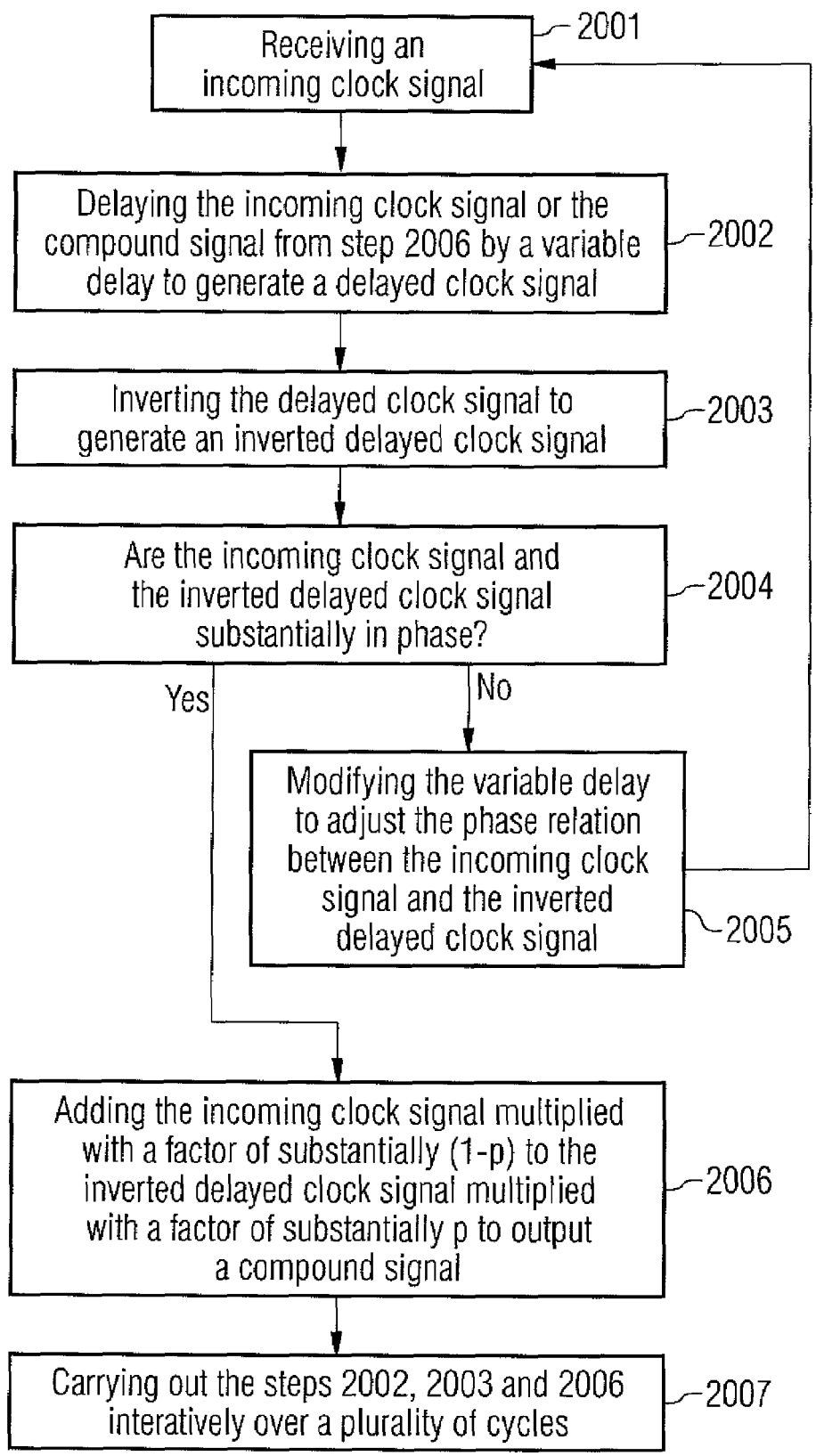
FIG. 2 illustrates an exemplary logic flow diagram illustrating operation of a DLL according to an embodiment of the invention.

FIG. 2 illustrates an exemplary logic flow diagram illustrating operation of a DLL according to an embodiment of the invention.

In step 2001, an incoming clock signal is received which is then, in step 2002, delayed by a variable delay. After that, in step 2003, the delayed clock signal is inverted to generate an inverted delayed clock signal. Thereon, in step 2004, it is determined if the incoming clock signal and the inverted delayed clock signal are substantially in phase.

If not, the variable delay is modified to adjust the phase relation between the incoming clock signal and the inverted delayed clock signal, in step 2005, and operation proceeds with step 2001.

If so, the incoming signal multiplied with a factor of substantially $(1-p)$ is added to the inverted delayed clock signal multiplied with a factor of substantially p to output a compound signal, in step 2006. After that, as indicated in step 2007 of FIG. 2, the steps 2002, 2003 and 2006 are carried out iteratively over a plurality of cycles to correct static duty-cycle offset of the incoming clock signal and to average out uncorrelated clock-jitter comprised in the incoming clock signal.

Figure 3:
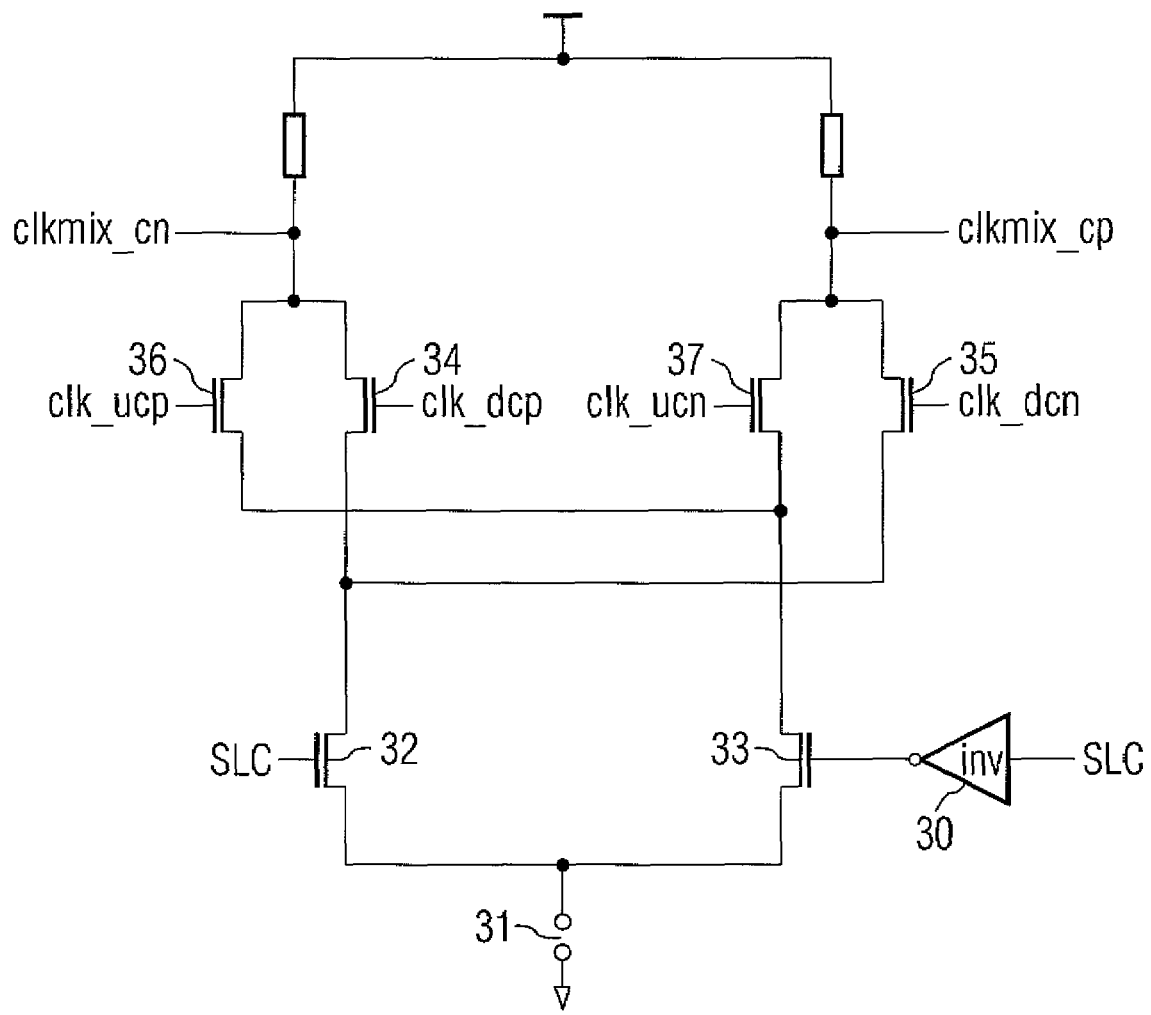
FIG. 3 illustrates a simplified schematic diagram of an exemplary implementation of the phase interpolator of the DLL in FIG. 1.

FIG. 3 illustrates a simplified schematic diagram of an exemplary implementation of the phase interpolator 23 of the DLL 20 in FIG. 1.

In the phase interpolator 23 illustrated in FIG. 3, differential clock signals are used. A differential clock signal consists of two complementary clock signals. The "actual" clock signal can be determined by comparing the two complementary clock signals. If the first clock signal of the two complementary clock signals is higher than the second one the "actual" clock signal is, for example, high ("1"). If the second clock signal of the two complementary clock signals is higher than the first one the "actual" clock signal is, for example, low ("0").

The phase interpolator 23 comprises a power source, an inverter 30, two sets of transistors 32, 33, and transistors 34, 35, 36, and 37.

The two sets of transistors 32 and 33 are respectively, for example, 15 transistors each of which can be independently driven by respective gate voltages. In order to control the gates of these transistors, the factor p is converted (not illustrated in FIG. 3) to a thermometer code, which consist in this example of fifteen bits. The proportion of the number of "1's" to the total number of bits, in this example 15 bits, may represent the factor p. As the arrangement of "0's" and "1's" is not relevant, that is, carries no information, the "1's" occupy the first positions, and the "0's" the last positions. In the following, some examples will be given:

a factor of 0 is represented by "000000000000000",
a factor of 1 is represented by "111111111111111"
a factor of ⅓ is represented by "111110000000000", and
a factor of ⅘ is represented by "111111111111000" in thermometer code.

The first set of transistors 32 are controlled by a received control signal SLC in thermometer code consisting of 15 bits and representing the factor p. Each bit of the thermometer code controls the gate of a respective transistor of the set of transistors 32. If the respective bit is a "1" the corresponding transistor will be on, that is, a current will flow through its drain and source. If the respective bit is a "0" the corresponding transistor will be off, that is, no current will flow through its drain and source.

The second set of transistors 33 are also controlled by the control signal SLC in thermometer code. However, the control signal SLC is inverted before being applied to the respective gates of the set of transistors 33, otherwise the control mechanism is the same as the one applied to the first set of transistors 32. The inversion of the control signal involves that the number of on-transistors of the second set of transistors 33 corresponds to the number of off-transistors of the first set of transistors 32 and vice versa.

In the following, the functionality of the phase interpolator 23 will only briefly be described on the basis of two extreme examples as the phase interpolator illustrated in FIG. 3 is a conventional phase interpolator well-known in the art.

First, the value of SLC is assumed to be "000000000000000". In this case, each transistor of the second set of transistors 33 is on and each transistor of the first set of transistors 32 is off. Therefore, voltage will be applied only to the transistors 36 and 37 which are connected to the transistors 33. The transistors 36 and 37 are controlled by differential clock signals clk_ucp and clk_ucn representing the incoming clock signal in FIG. 2. In this case, the differential clock signals, clkmix_cp and clkmix_cn, output by the phase interpolator 23 correspond to the incoming clock signal in FIG. 2 (represented as differential clock signals).

Next, the value of SLC is assumed to be "111111111111111". In this case, each transistor of the second set of transistors 33 is off and each transistor of the first set of transistors 32 is on. Therefore, voltage will be applied only to the transistors 34 and 35 which are connected to the transistors 32. The transistors 34 and 35 are controlled by differential clock signals clk_dcp and clk_dcn representing the outgoing clock signal in FIG. 2. In this case, the differential clock signals, clkmix_cp and clkmix_cn, output by the phase interpolator 23 correspond to the outgoing clock signal in FIG. 2 (represented as differential clock signals).

For values of SLC lying in between the above two extreme examples, each of the transistors 34, 35, 36, and 37 will make some contribution—according to the value of SLC—to the clock signal output by the phase interpolator 23. For these cases, the phase interpolator 23 statically phase-mixes the incoming and outgoing clock signals to a contribution of p for the outgoing clock signal and to a contribution of (1−p) for the incoming clock signal.

FIG. 4 depicts a graph illustrating duty-cycle correction results numerically calculated for a simulated DLL in accordance with the invention.

The graph illustrates the corrected duty-cycle of the outgoing signal in dependence of the original duty-cycle of the incoming signal for a constant weighing factor p=0.7 of the phase interpolator. The duty-cycles of the incoming signal vary within a region from 42.5% to 50%, whereas the corrected duty-cycles of the outgoing signals vary only within a region from 51.4% to 50%. For example, the graph indicates an improvement of a duty-cycle of 45% of the incoming signal to a duty-cycle of 50.9% of the outgoing signal.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A clock signal synchronizing device comprising:
a delay circuit having a variable delay time and delaying an incoming clock signal or a signal generated therefrom to output a delayed clock signal;
a negator for inverting the delayed clock signal to output an inverted delayed clock signal;
a delay control circuit for controlling the delay circuit to adjust the phase relation between the incoming clock signal and the inverted delayed clock signal;
a phase interpolator; and
a phase interpolator control circuit;
wherein the phase interpolator adds the incoming clock signal multiplied with a factor of substantially (1−p) to the inverted delayed clock signal multiplied with a factor of substantially p to output a compound signal to the delay circuit, p being a real number greater than or equal to 0 and smaller than or equal to 1; and
wherein the phase interpolator control circuit sets the value of p to substantially 0 when the incoming clock signal and the inverted delayed clock signal are not in phase, and sets the value of p to a value greater than 0 and smaller than or equal to 1 when the incoming clock signal and the inverted delayed clock signal are substantially in phase.

2. The clock signal synchronizing device of claim 1, further comprising a further delay circuit having a constant delay time and being connected between the output of the delay circuit having a variable delay time and an input of the negator.

3. The clock signal synchronizing device of claim 1, wherein the incoming clock signal is a differential clock signal.

4. The clock signal synchronizing device of claim 1, wherein the variable delay time of the delay circuit is adjusted by respectively incrementing the variable delay time by a predetermined step until the incoming clock signal and the inverted delayed clock signal are in phase.

5. The clock signal synchronizing device of claim 1, wherein the variable delay time of the delay circuit is adjusted by respectively decrementing the variable delay time by a predetermined step until the incoming clock signal and the inverted delayed clock signal are in phase.

6. The clock signal synchronizing device of claim 1, wherein the delay circuit delays the compound signal;
the negator inverts the delayed compound signal; and
the phase interpolator adds the incoming clock signal multiplied with a factor of substantially (1−p) to the inverted delayed compound clock signal multiplied with a factor of substantially p to output a further compound signal to the delay circuit.

7. The clock signal synchronizing device of claim 6, wherein the steps specified in claim 6 are carried out iteratively over a plurality of cycles to correct static duty-cycle offset of the incoming clock signal and to average out uncorrelated clock-jitter comprised in the incoming clock signal.

8. A clock signal synchronizing device comprising:
a delay circuit having a variable delay time and delaying an incoming clock signal or a signal generated therefrom to output a delayed clock signal;
a negator for inverting the delayed clock signal to output an inverted delayed clock signal;
a delay control circuit for controlling the delay circuit to adjust the phase relation between the incoming clock signal and the inverted delayed clock signal;
a phase interpolator;
wherein the phase interpolator is activated when the incoming clock signal and the inverted delayed clock signal are substantially in phase and adds the incoming clock signal multiplied with a factor of substantially (1−p) to the inverted delayed clock signal multiplied with a factor of substantially p to output a compound signal to the delay circuit, p being a real number greater than or equal to 0 and smaller than or equal to 1.

9. The clock signal synchronizing device of claim 8, further comprising a further delay circuit having a constant delay time and being connected between the output of the delay circuit having a variable delay time and an input of the negator.

10. The clock signal synchronizing device of claim 8, wherein the incoming clock signal is a differential clock signal.

11. The clock signal synchronizing device of claim 8, further comprising a phase interpolator control circuit connected to the phase interpolator, the phase interpolator control circuit generating a control signal comprising a value for the factor p being greater than 0 to activate the phase interpolator.

12. The clock signal synchronizing device of claim 8, wherein the delay circuit delays the compound signal by the adjusted variable delay time;
the negator inverts the delayed compound signal; and
the phase interpolator adds the incoming clock signal multiplied with a factor of substantially (1−p) to the inverted delayed compound clock signal multiplied with a factor of substantially p to output a further compound signal to the delay circuit.

13. The clock signal synchronizing device of claim 12, wherein the steps specified in claim 12 are carried out iteratively over a plurality of cycles to correct static duty-cycle offset of the incoming clock signal and to average out uncorrelated clock-jitter comprised in the incoming clock signal.

14. A clock signal synchronizing method for use in a clock signal synchronizing device comprising a delay control circuit connected to a delay circuit having a variable delay time, a negator, and a phase interpolator, the method comprising:
receiving an incoming clock signal;
delaying, by the delay circuit, the incoming clock signal or a signal generated therefrom to generate a delayed clock signal;
inverting, by the negator, the delayed clock signal to generate an inverted delayed clock signal;
controlling, by the delay control circuit, the delay circuit to adjust the phase relation between the incoming clock signal and the inverted delayed clock signal; and
when the incoming clock signal and the inverted delayed clock signal are substantially in phase, adding, by the phase interpolator, the incoming clock signal multiplied with a factor of substantially (1−p) to the inverted delayed clock signal multiplied with a factor of substantially p to output a compound signal to the delay circuit, p being a real number greater than or equal to 0 and smaller than or equal to 1.

15. The method of claim 14, further comprising:
delaying, by the delay circuit, the compound signal;
inverting, by the negator, the delayed compound clock signal to generate an inverted delayed compound clock signal; and
adding, by the phase interpolator, the incoming clock signal multiplied with a factor of substantially (1−p) to the inverted delayed compound clock signal multiplied with a factor of substantially p to output a further compound signal to the delay circuit.

16. The method of claim 15, wherein the steps specified in claim 15 are carried out iteratively over a plurality of cycles to correct static duty-cycle offset of the incoming clock signal and to average out uncorrelated clock-jitter comprised in the incoming clock signal.

17. The method of claim 14, wherein the phase interpolator is caused to operate by a control signal comprising a value for the factor p being greater than 0.

18. The method of claim 14, wherein the variable delay time of the delay circuit is adjusted by respectively incrementing the variable delay time by a predetermined step until the incoming clock signal and the inverted delayed clock signal are in phase.

19. The method of claim 14, wherein the variable delay time of the delay circuit is adjusted by respectively decrementing the variable delay time by a predetermined step until the incoming clock signal and the inverted delayed clock signal are in phase.

20. Integrated circuit chip, comprising the clock signal synchronizing device of claim 1.

* * * * *